(12) United States Patent
Yamamoto

(10) Patent No.: US 6,380,792 B1
(45) Date of Patent: Apr. 30, 2002

(54) SEMICONDUCTOR INTEGRATED CIRCUIT

(75) Inventor: Showhei Yamamoto, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/615,707

(22) Filed: Jul. 13, 2000

(30) Foreign Application Priority Data

Oct. 12, 1999 (JP) .......................................... 11-289518

(51) Int. Cl.[7] .............................................. H03K 17/16
(52) U.S. Cl. ...................................... 327/390; 327/536
(58) Field of Search ............................. 326/33, 88, 92, 326/113; 327/108, 111, 112, 390, 530, 534, 535, 536

(56) References Cited

U.S. PATENT DOCUMENTS

| | | | | | |
|---|---|---|---|---|---|
| 5,041,739 A | * | 8/1991 | Goto | ...................... | 307/296.2 |
| 5,216,290 A | * | 6/1993 | Childers | .................. | 307/296.1 |
| 5,241,502 A | * | 8/1993 | Lee et al. | .................... | 365/203 |
| 5,552,747 A | * | 9/1996 | Tomasini et al. | ........... | 327/536 |
| 5,594,380 A | * | 1/1997 | Nam | ........................... | 327/390 |
| 5,646,571 A | * | 7/1997 | Ohashi | ....................... | 327/390 |
| 6,229,740 B1 | * | 5/2001 | Ogura | ................... | 365/189.11 |

* cited by examiner

Primary Examiner—Jeffrey Zweizig
(74) Attorney, Agent, or Firm—Volentine Francos, PLLC

(57) ABSTRACT

A semiconductor integrated circuit capable of achieving drain current and transconductance required for driving an analog switch even after lowering a supply voltage. The circuit includes a boosting section for generating a voltage equal to or greater than the supply voltage, and an output section for outputting a voltage generated by the boosting section according to an input signal. The boosting section includes a capacitor for storing electric charges equivalent to a difference between the voltage equal to or greater than the supply voltage and the supply voltage. Accordingly, a voltage equal to or greater than the supply voltage can be applied to the analog switch requiring large transconductance. Therefore, even if the supply voltage is decreased, a percentage of a reduction of the transconductance can be relatively low, whereby a voltage of electronic equipment can be lowered.

17 Claims, 5 Drawing Sheets

SEMICONDUCTOR INTEGRATED CIRCUIT

BACKGROUND OF THE INVENTION

The present invention relates to a semiconductor integrated circuit, and more particularly to a switching circuit.

In a field of circuits for use in portable telecommunication equipment, lowering electric power is significantly required. In general, obstacles to lowering electric power of electronic equipment are MOS transistors (hereinafter, referred to as "MOS") requiring large transconductance gm among components of the electronic equipment and an inverter or other logical gates. For example, in portable telecommunication equipment, a switch (hereinafter, referred to as "analog switch") formed by the MOS is used for switching an input-output section for voice or other analog data, thereby obstructing lowering electric power.

As an example, a description will be made below for a semiconductor integrated circuit comprising an analog switch used for portable telecommunication equipment and its driver by referring to FIG. 8. A semiconductor integrated circuit 500, as shown in FIG. 8, comprises an analog switch 510 for switching an input-output section for analog data and a driver 520 for driving the analog switch 510.

The analog switch 510 comprises a P-channel MOS transistor (hereinafter, referred to as "PMOS") M1 and an N-channel MOS transistor (hereinafter, referred to as "NMOS") M2. A source of the PMOS M1 and a drain of the NMOS M2 are connected to an input terminal T1 to which analog data is inputted. A drain of the PMOS M1 and a source of the NMOS M2 are connected to an output terminal T2 to which analog data is outputted. An analog switch 510 having this configuration is also referred to as a transfer gate and widely used for a formation of a switched capacitor filter (SCF) circuit or of an integrating circuit.

The driver 520 comprises a control signal input terminal T3 to which a control signal is inputted for driving the analog switch 510, inverters INV1 and INV2 connected in series to the input terminal T3, and an inverter INV3 connected to the input terminal T3 and connected in parallel to the inverters INV1 and INV2. An output of the inverters INV1 and INV2 connected in series is connected to a gate G1 of the PMOS M1. An output of the INV3 is connected to a gate G2 of the NMOS M2. A signal inputted to the input terminal T3 is a supply voltage VDD at an H level or a ground voltage GND at an L level.

Logical levels are inverted between an output of the inverter INV2 and an output of the inverter INV3 which are outputs of the driver 520. Normally an output of an inverter is at either the supply voltage VDD or the ground voltage GND, and therefore the supply voltage VDD is applied to one of the gate G1 of the PMOS M1 to which the output of the inverter INV2 is applied and the gate G2 of the NMOS M2 to which the output of the inverter INV3 is applied, while the ground voltage GND is applied to the other.

For example, if the input terminal T3 is at the supply voltage VDD, the gate G1 of the PMOS M1 is at the supply voltage VDD and the gate G2 of the NMOS M2 is at the ground voltage GND, and therefore the analog switch 510 is not driven. If the input terminal T3 is at the ground voltage GND, the gate G1 of the PMOS M1 is at the ground voltage GND and the gate G2 of the NMOS M2 is at the supply voltage VDD, and therefore the analog switch 510 is driven.

As described above, outputs of the inverters are at the supply voltage VDD or at the ground voltage GND. The transconductance gm of the MOS in this condition will be considered below. To consider the transconductance gm, drain current $I_D$ is described, first.

The drain $I_D$ of the MOS is expressed by the following equation (equation 1):

$$I_D = \beta(V_{GS} - V_T)^2 / 2 \tag{1}$$

where $V_{GS}$ is a gate-to-source voltage (also simply referred to as "gate voltage"), $V_T$ is a threshold voltage, and $\beta$ is a constant proportional to dimensions of an MOS determined according to an effective channel length and an effective channel width of the MOS.

If the current $I_D$ expressed by the equation (1) is differentiated by the gate voltage $V_{GS}$, the following equation is obtained:

$$gm = dI_D/dV_{GS} = \beta(V_{GS} - V_T) \tag{2}$$

The characteristics of the MOS are represented by using the drain current $I_D$ or the transconductance gm. According to the equation (1) or (2), it is understood that the drain current is proportional to a square of the gate voltage $V_{GS}$ and that the transconductance gm is proportional to the gate voltage $V_{GS}$.

In the semiconductor integrated circuit 500, the gate voltage $V_{GS}$ is equal to the supply voltage VDD, and therefore the transconductance gm between the terminal T1 and the terminal T2 is decreased together with a reduction of the supply voltage VDD. Additionally in the above circuit configuration, it is understood that the transconductance gm of the analog switch is decreased when the supply voltage VDD reaches about the same voltage as (PMOS M1 threshold value $V_{Tp}$)+(NMOS M2 threshold value $V_{Tn}$) according to the equation (2).

Consideration will be given below for a case in which the supply voltage VDD is decreased from 2.0 V to 1.8 V when the threshold voltage $V_{Tp}$ of the PMOS M1 is −0.8 V and the threshold voltage $V_{Tn}$ of the NMOS M2 is 0.8 V, for example. If the supply voltage VDD is 2.0 V, $(V_{GS}-V_{Tp})$ of the PMOS M1 equals −1−(−0.8)=−0.2 (V) and $(V_{GS}-V_{Tn})$ of the NMOS M2 equals 1−0.8=0.2 (V). Subsequently when the supply voltage VDD is decreased to 1.8 V, $(V_{gs}-V_{Tp})$ of the PMOS M1 equals −0.9−(−0.8)=−0.1 (V) and $(V_{gs}-V_{Tn})$ of the NMNOS M2 equals 0.9−0.8=0.1 (V).

At this moment, as described above, the drain current $I_D$ of the MOS is proportional to a square of the gate voltage $V_{GS}$ and the transconductance gm is proportional to the gate voltage $V_{GS}$, and therefore if the supply voltage VDD is lowered from 2V to 1.8 V, the drain current $I_D$ is decreased to $(0.1/0.2)^2 = 25(\%)$ and the transconductance gm is decreased to (0.1/0.2)=50 (%).

As described above, when the supply voltage VDD is decreased to lower the voltage and the supply voltage VDD approaches (the threshold value $V_{Tp}$ of the PMOS M1) plus (the threshold value $V_{Tn}$ of the NMOS M2), it is required to secure the drain current $I_D$ and the transconductance gm of the MOS forming the analog switch. As a means for securing the transconductance gm, there is a method of increasing dimensions of the MOS to increase the constant β in the equation (2).

Increasing the dimensions of the MOS, however, increases a capacity among the gate, the drain, and the source, thereby increasing injected electric charges to generate big switching noises. Therefore, there has been a limitation on securing the transconductance gm by increasing the dimensions of the MOS.

SUMMARY OF THE INVENTION

It is an object of the present invention to provide a semiconductor integrated circuit capable of achieving drain current and transconductance required for driving an analog switch even after lowering a supply voltage.

In order to accomplish the above object, the present invention provides a semiconductor integrated circuit comprising a transistor for a switch for transmitting an input signal given to one terminal to the other terminal according to a voltage given to a gate electrode, a boosting section for generating a higher voltage than a supply voltage, and an output section for giving the voltage generated by the boosting section to the gate electrode of the transistor for a switch.

DETAILED DESCRIPTION OF THE PREFERRED EMBODIMENTS

Figure 1:
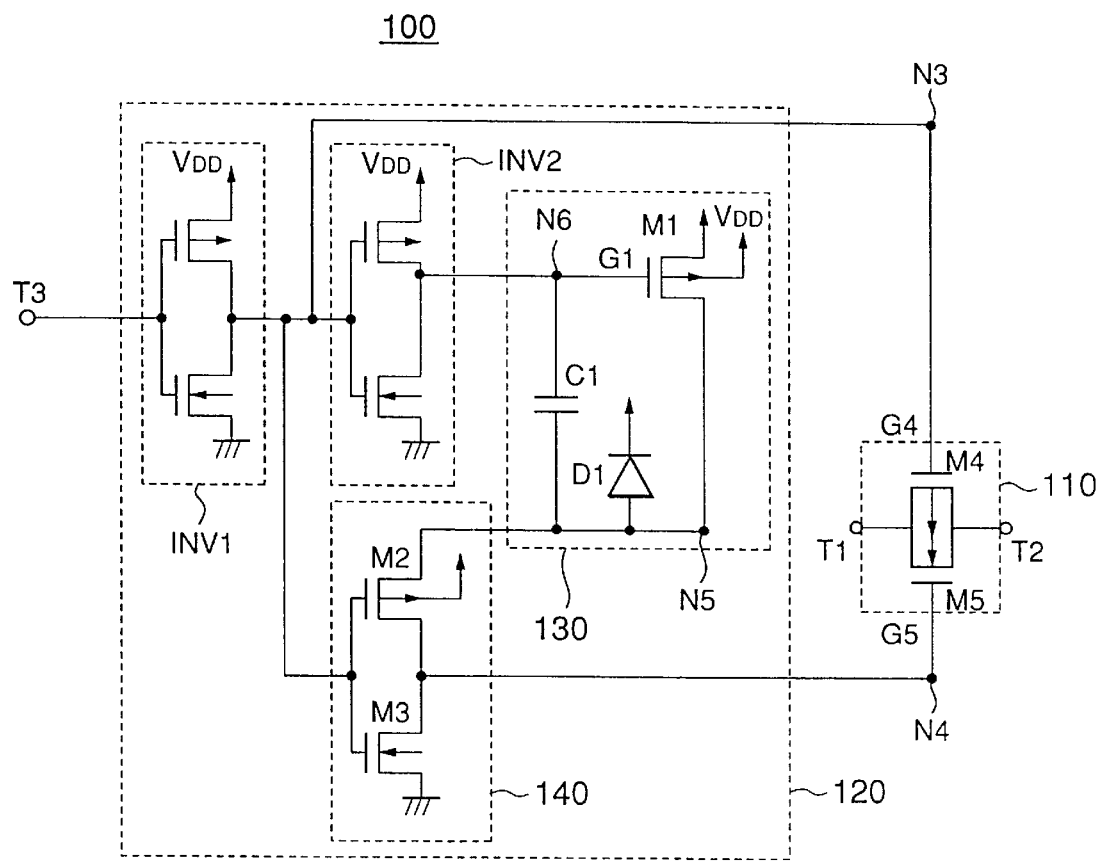
FIG. 1 is an explanatory diagram of a semiconductor integrated circuit according to a first embodiment.

Preferred embodiments of a semiconductor integrated circuit according to this invention will be described in detail below by referring to the accompanying drawings. In this specification and drawings, components having substantially the same functional configuration are designated by the same reference characters, by which a repetition of the description is omitted here.

First Embodiment

A semiconductor integrated circuit 100 according to this embodiment is described below with referring to FIG. 1.

As shown in FIG. 1, the semiconductor integrated circuit 100 comprises a driver 120 including a boosting section 130 for generating a voltage equal to or greater than the supply voltage and an output section 140 for outputting a voltage equal to or greater than the supply voltage generated by the boosting section 130 according to an input signal with being connected to the boosting section 130. The driver 120 drives an analog switch 110 for inputting or outputting analog data.

The analog switch 110 comprises a PMOS M4 and an NMOS M5. A source of the PMOS M4 and a drain of the NMOS M5 are connected to an input terminal T1 to which analog data is inputted. A drain of the PMOS M4 and a source of the NMOS M5 are connected to an output terminal T2 to which analog data is output.

The driver 120 comprises an input terminal T3 to which a control signal is inputted for controlling the analog switch 110, two input inverters INV1 and INV2 connected in series to the input terminal T3, a boosting section 130 for generating a voltage equal to or greater than the supply voltage, and an output section 140 for applying a voltage equal to or greater than the supply voltage generated by the boosting section 130 to the analog switch 110 according to an output of the inverter INV1 with being connected to the boosting section 130.

The output of the inverter INV1 is connected to a gate G4 of the PMOS M4 in the analog switch 110 and connected to a gate G5 of the NMOS M5 in the analog switch 110 via the output section 140. Furthermore, the output of the inverter INV1 is connected to the boosting section 130 via the inverter INV2.

The supply voltage VDD and the ground voltage GND are applied to the inverters INV1 and INV2, which output the VDD at the H level and the GND voltage at the L level, respectively.

The boosting section 130 includes a capacitor C1 storing electric charges equivalent to a difference between a voltage at least equal to or greater than the supply voltage and the supply voltage and a PMOS M1. A source of the PMOS M1 is connected to a power supply and its drain is connected to a source of a PMOS M2 forming the output section 140. The capacitor C1 is connected between a gate G1 of the PMOS M1 and the drain thereof. A reference character D1 in this diagram designates a parasitic diode between the drain of the PMOS M1 and NWELL.

The output section 140 comprises the PMOS M2 and NMOS M3; the PMOS M2 and the NMOS M3 are connected in series between an output of the inverter INV1 and the gate G5 of the NMOS M5 in the analog switch 110. The source of the PMOS M2 is connected to the drain of the PMOS M1 and the drain of the PMOS M2 is connected to the drain of the NMOS M3. The source of the NMOS M3 is grounded. While the output section 140 in this configuration has a function of inverting a logical level like a normal inverter, it differs from the normal inverter in that a voltage equal to or greater than the supply voltage VDD is applied to the gate G5 of the NMOS M5 on a rear stage when the ground voltage GND is applied, as described later.

An operation of the semiconductor integrated circuit 100 having the above configuration is described below, assuming that the supply voltage VDD is 2 V, the ground voltage GND is 0 V, a threshold voltage $V_{TD1}$ of the parasitic diode D1 is 0.5 V.

First, when the input terminal T3 is at 0 V, an output node N3 is at 2 V due to the inverter INV1. An output node N6 of the inverter INV2 is at 0 V, the PMOS M1 is set on, and a node N5 connected to the drain of the PMOS M1 is at 2 V. Since an output of the inverter INV1 is at 2 V and therefore an output node N4 of the output section 140 is at 0 V. Since the node N3 is at 2 V and the node N4 is at 0 V, an analog switch 110 is set off. In this condition, an electric potential difference (N6−N5)$V_{c1}$ across the capacitor C1 is −2 V.

Figure 2:
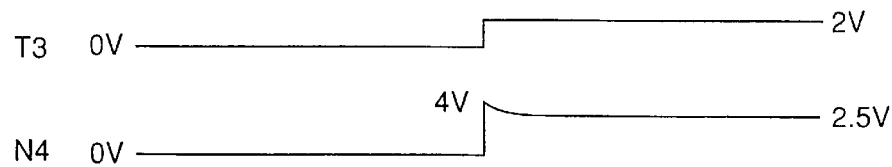
FIG. 2 is a timing chart for the semiconductor integrated circuit shown in FIG. 1.

Subsequently if the input terminal T3 is shifted from 0 V to 2 V as shown in FIG. 2, the node N3 is shifted from 2 V to 0 V and a node N6 is shifted from 0 V to 2 V, by which the PMOS M1 is set off. In the output section 140, the PMOS M2 is set on and the NMOS M3 is set off. In this condition, electric charges of the capacitor C1 are stored and the electric potential difference $V_{c1}$ is −2 V as it is, by which a voltage of the node N5 shifts from 2 V to 4 V with a shift of the node N6 from 0 V to 2 V. At this moment, the parasitic diode D1 is set on and the voltage $V_{N5}$ of the node N5 is constantly on until it reaches $V_{N5}-VDD < V_{TD}$. Therefore, the voltage $V_{T5}$ of the node N5 equals VDD+$V_{TD}$=2.5 V. Since the PMOS M2 in the output section 140 is set on, the node N4 also becomes at 2.5 V.

Regarding the transconductance gm of the MOS forming the analog switch 110 in the semiconductor integrated circuit 100 according to this embodiment, it is described below in comparison with the prior art in the above. Consideration is given to a case in which the threshold voltage $V_{TD}$ of the parasitic diode D1 is equal to 0.5 V and that the supply voltage VDD is reduced from 2 V to 1.8 V. If the supply voltage VDD is 2 V, both of the voltages of the input terminal T1 and the output terminal T2 are 1 V. When a voltage of the input terminal T3 is 2 V, a voltage of the node N3 is 0 V and a voltage of the, node N4 equals VDD+$V_{TD}$= 2.5 V. Therefore, ($V_{gs}$-$V_{Tn}$) of the NMOS M5 forming the analog switch 110 is 0.7 V which is higher than that of the conventional circuit by $V_{TD}$=0.5 V. By decreasing the supply voltage VDD from 2 V to 1.8 V, ($V_{gs}$-$V_{Tn}$) of the NMOS M5 becomes 0.6 V which is higher than that of the conventional circuit by $V_{TD}$=0.5 V.

The transconductance gm of the NMOS M5 is proportional to ($V_{gs}$-$V_{Tn}$) and therefore at 1.8 V of VDD the transconductance gm of the NMOS M5 is equal to 0.6/0.7= 85.7% in comparison with that for VDD=2.0 V. In the conventional circuit the transconductance gm is decreased to 50% if the supply voltage VDD is reduced from 2 V to 1.8 V, and therefore a significant improvement is achieved. Accordingly, required transconductance gm is obtained without increasing dimensions of M5.

In addition, the drain current $I_D$ of the NMOS M5 is proportional to a square of ($V_{gs}$-$V_{Tn}$) and therefore at 1.8 V of VDD the drain current $I_D$ of the NMOS M5 is $(0.6/0.7)^2 = 73.5\%$ in comparison with that for VDD=20 V. In the conventional circuit the transconductance gm is decreased to 25% if the supply voltage VDD is reduced from 2 V to 1.8 V, and therefore a significant improvement is achieved.

According to this embodiment, a voltage equal to or greater than the supply voltage can be applied to the analog switch 110. Therefore, a percentage of a reduction of the transconductance of the PMOS M5 can be relatively decreased even if the supply voltage is lowered. Therefore, it is possible to lower a voltage of the electronic equipment in which the semiconductor integrated circuit 100 is used.

Second Embodiment

Figure 3:
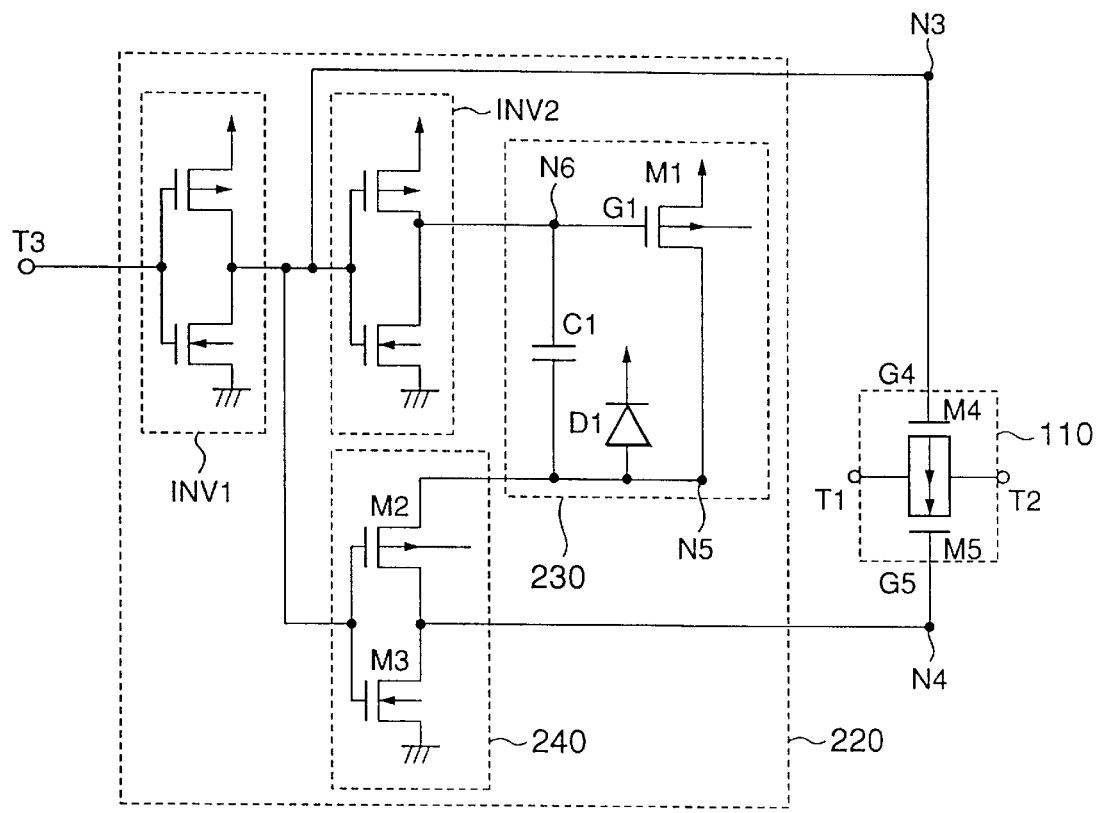
FIG. 3 is an explanatory diagram of a semiconductor integrated circuit according to a second embodiment.
Figure 4:
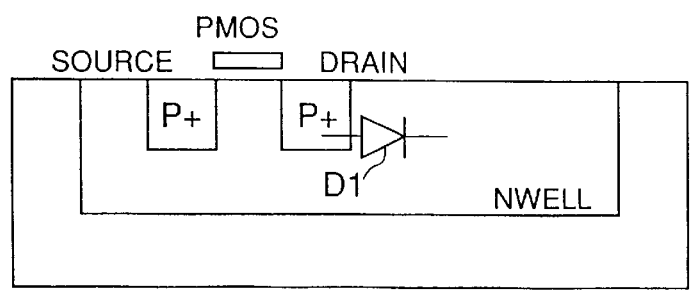
FIG. 4 is an explanatory diagram of a parasitic diode used for the semiconductor integrated circuit shown in FIG. 3.

A semiconductor integrated circuit 200 according to this embodiment will be described below by referring to FIGS. 3 and 4. The semiconductor integrated circuit 200 is an improvement of the above described semiconductor integrated circuit 100, and therefore only differences from the semiconductor integrated circuit 100 will be described here. The semiconductor integrated circuit 200 has a bulk of a PMOS M1 and a parasitic diode D1 which are not connected to VDD. In other words, in a. PMOS M1 in a boosting section 230 and a PMOS M2 in an output section 240, an NWELL physically formed in wafer is not connected to the supply voltage VDD as shown in FIG. 4.

Although an operation of the semiconductor integrated circuit 200 is substantially the same as an operation of the semiconductor integrated circuit 100, electric charges do not flow through the parasitic diode D1 when an input terminal T3 shifts from 0 V to 2V and a node N5 shifts from 2 V to 4 V, and therefore a node N4 is maintained to be at 4 V. Then, a voltage of 4 V is applied to a gate of the NMOS M5 in the analog switch 110 by the output section 240.

Transconductance gm of an MOS forming the analog switch 210 in the semiconductor integrated circuit 200 according to this embodiment will be described below in comparison with the prior art in the above. Assuming that the supply voltage is 2 V under the same conditions as for the first embodiment, ($V_{gs}$-$V_{Tn}$) of the NMOS M5 forming the analog switch 110 is higher than that of the conventional circuit by $V_{c1}$=2V so as to be 2.2 V. If the supply voltage is lowered from 2 V to 1.8 V, ($V_{gs}$-$V_{Tn}$) of the NMOS M5 becomes higher than that of the conventional circuit by $V_{c1}$=2 V to be 2.1 V.

Since the transconductance gm of the NMOS M5 is proportional to ($V_{gs}$-$V_{Tn}$), the transconductance gm of the NMOS M5 is 2.1/2.2=95.5% at 1.8 V of VDD in comparison with that for VDD=2.0 V. In the conventional circuit, the transconductance gm is lowered to be 50% if the supply voltage VDD is lowered from 2 V to 1.8 V and therefore a significant improvement is achieved. Therefore, required transconductance gm is obtained without increasing dimensions of the MS.

Since drain current $I_D$ of the NMOS M5 is proportional to a square of ($V_{gs}$-$V_{Tn}$), the drain current $I_D$ of the NMOS M5 is $(2.1/2.2)^2$=91.1% at 1.8 V of VDD in comparison with that for VDD=2.0 V. In the conventional circuit, the transconductance gm is lowered to be 25% if the supply voltage VDD is lowered from 2 V to 1.8 V, and therefore a significant improvement is achieved.

In this embodiment electric charges stored in a capacitor C1 do not flow out through the parasitic diode D1, and therefore it is possible to apply a higher voltage to the analog switch 110 in comparison with the first embodiment. Therefore, required transconductance gm can be secured without increasing dimensions of the PMOS M5.

Third Embodiment

Figure 5:
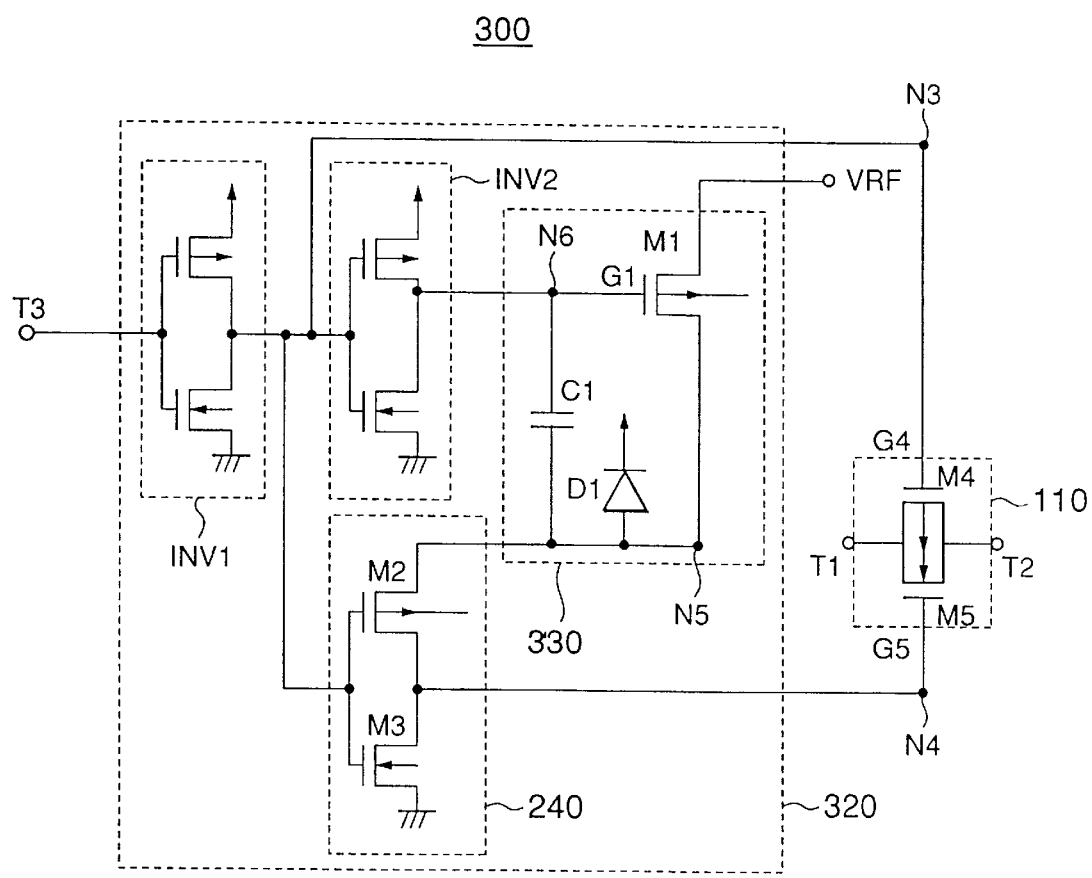
FIG. 5 is an explanatory diagram of a semiconductor integrated circuit according to a third embodiment.

A semiconductor integrated circuit 300 according to this embodiment will be described below by referring to FIG. 5. The semiconductor integrated circuit 300 is an improvement of the semiconductor integrated circuit 200 in the above, with a drain of a PMOS M1 in a boosting section 330 connected to a voltage source VRF having smaller fluctuations than those of a supply voltage VDD. As this voltage source VRF, a band-gap generator can be used for example.

Although an operation of the semiconductor integrated circuit 300 is the same as an operation of the semiconductor integrated circuit 200, a node N5 is maintained within a range of a VRF voltage to the double of the VRF voltage when an input terminal T3 shifts from 0 V to 2 V. Then, the double of the VRF voltage is applied to a gate of an NMOS M5 in an analog switch 110 by the output section 140.

If a fluctuation value of the VRF voltage is smaller than that of the VDD, a fluctuation of $V_{gs}$ of the NMOS M5 forming the analog switch is smaller than that of the first or second embodiment, and therefore a fluctuation of the transconductance gm of the NMOS M5 also becomes smaller, by which stable characteristics can be obtained against fluctuations of the supply voltage.

Furthermore, by controlling the voltage source VRF, a relationship of the transconductance gm can be changed without a change of dimensions of the NMOS M5. Therefore, the transconductance gm can be adjusted even after the dimensions of the NMOS M5 are changed to those causing less switching noises.

Fourth Embodiment

Figure 6:
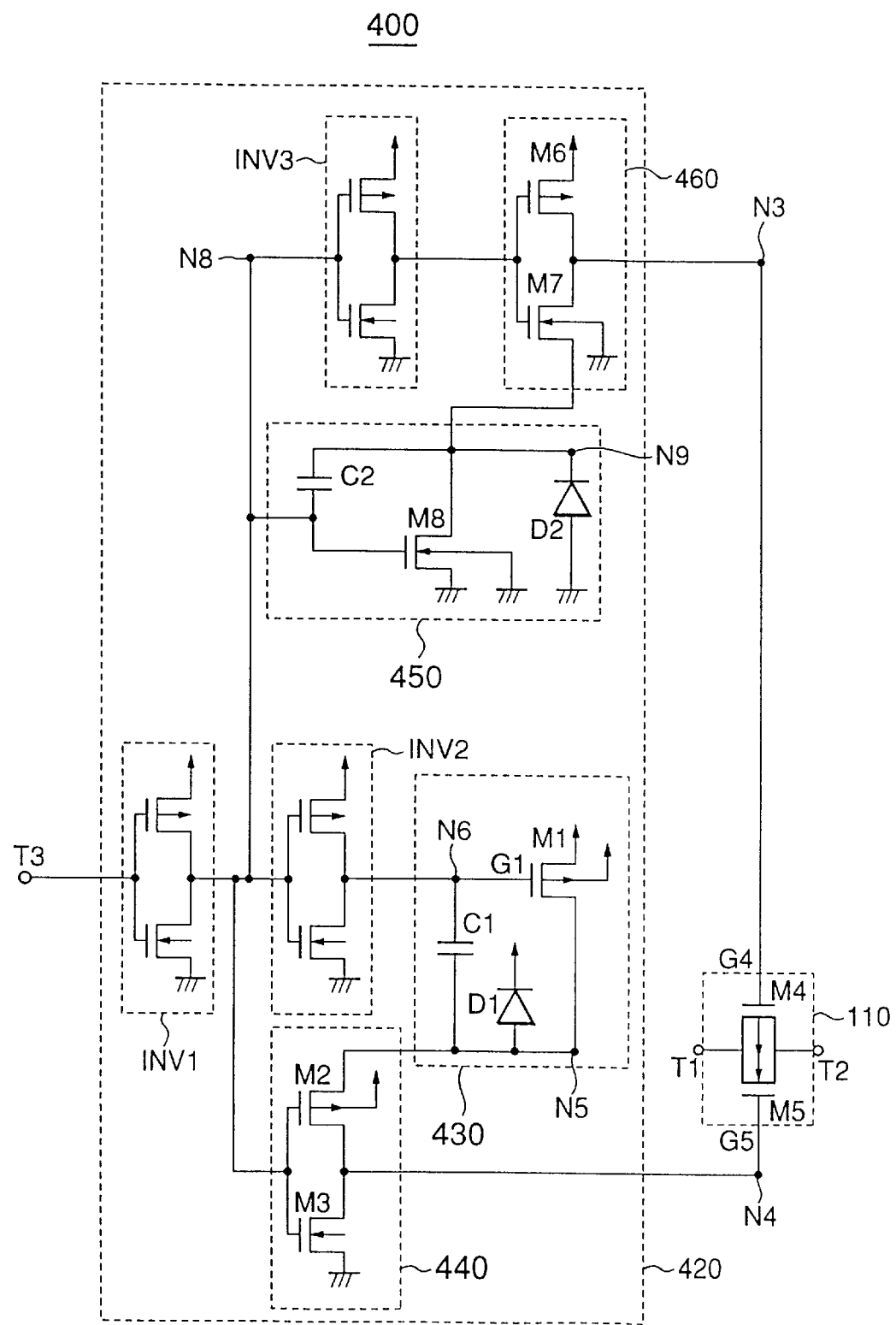
FIG. 6 is an explanatory diagram of a semiconductor integrated circuit according to a fourth embodiment.

A semiconductor integrated circuit 400 according to this embodiment will be described below by referring to FIGS. 6 and 7. The semiconductor integrated circuit 400 is an improvement of the semiconductor integrated circuit 100 in the above, with a gate terminal G4 of a PMOS M4 in an analog switch 110 additionally connected to a step-down section 450 and to a second output section 460. In other words, in this embodiment the present invention is characterized in that a gate voltage of an NMOS M5 in the analog switch 110 is increased and that a gate voltage of the PMOS M4 is decreased. Only the step-down section 450 and the second output section 460 are described below.

The boosting section 450 includes a capacitor C2 storing electric charges equivalent to at least a difference between a supply voltage and a voltage equal to or smaller than a ground voltage and an NMOS M8. A drain of the NMOS M8 is grounded and its source is connected to a source of an NMOS M7 forming the second output section 460. A capacitor C2 is connected between a gate of the NMOS M8 and the source of the NMOS M7. A reference character D2 in FIG. 6 designates a parasitic diode between the drain of the NMOS M8 and a PWELL.

The second output section 460 comprises a PMOS M6 and an NMOS M7, the PMOS M6 and the NMOS M7 being connected in parallel between an output of an inverter INV3 and the gate G4 of the PMOS M4 in the analog switch 110. The source of the NMOS M7 is connected to the drain of the NMOS M8 and a drain of the NMOS M7 is connected to a drain of a PMOS M6. A source of the PMOS M6 is connected to a power supply. While the second output section 460 in this configuration has a function of inverting a logical level like a normal inverter, it differs from a normal inverter in that a voltage equal to or smaller than the ground voltage is applied to the gate G4 of the PMOS M4 in a rear stage as described later when the supply voltage VDD is applied.

An operation of the semiconductor integrated circuit 400 having the above configuration will be described below. A threshold voltage VTD2 of a parasitic diode D2 is assumed to be 0.5 V and other conditions are to be the same as for other embodiments.

First, if an input terminal T3 is at 0 V, an output node N8 is at 2 V due to an inverter INV1. The NMOS M8 is set on and a node N9 grounded to the drain of the NMOS M8 is at 0 V. Since an output of the inverter INV3 is at 0 V, an output node N3 of the second output section 460 is at 2 V. Since the node N3 is at 2 V and a node N4 is at 0 V in the same manner as for other embodiments, the analog switch 110 is off. In this condition, an electric potential difference (N8-N9) across the capacitor C2 is 2 V.

Figure 7:
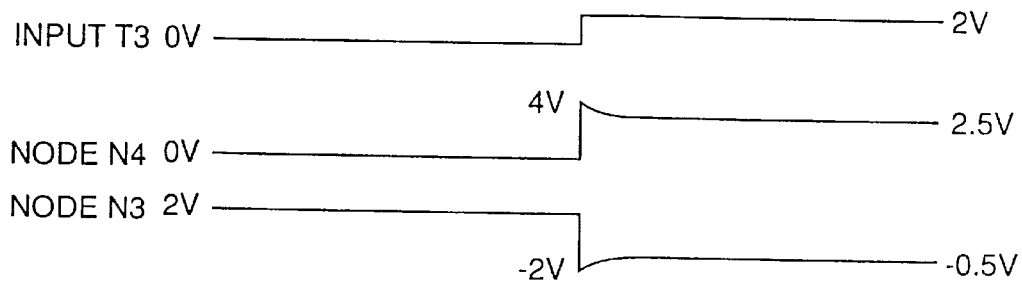
FIG. 7 is a timing chart of the semiconductor integrated circuit shown in FIG. 6.
Figure 8:
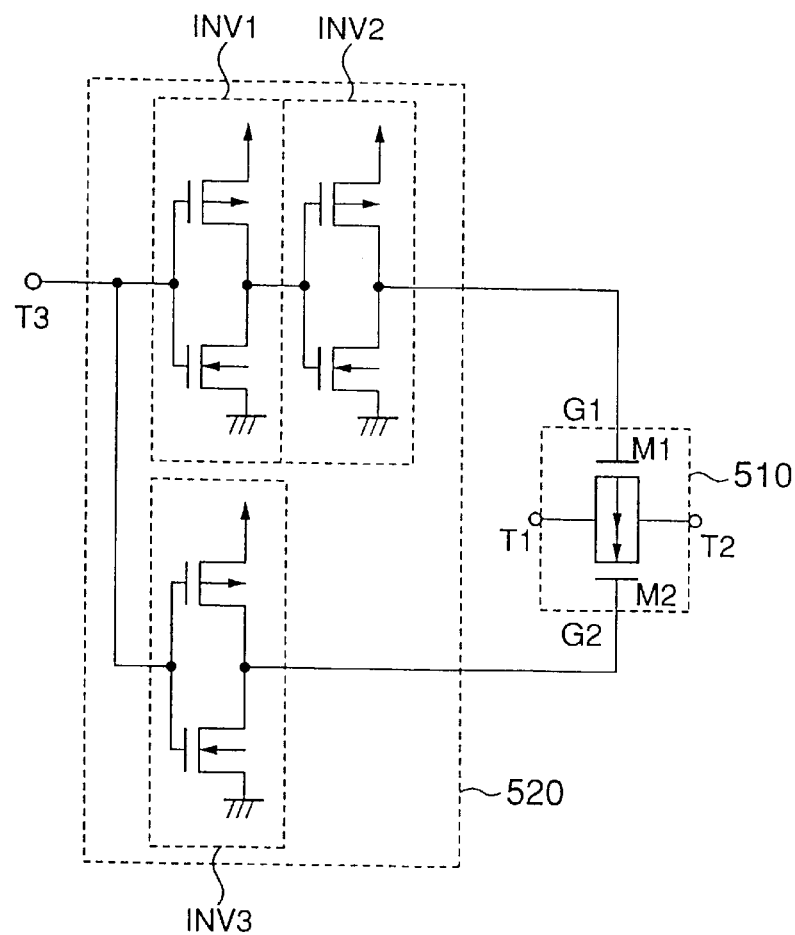
FIG. 8 is an explanatory diagram of a conventional semiconductor integrated circuit.

Next, if an input terminal T3 is shifted from 0 V to 2 V as shown in FIG. 7, a node N8 shifts from 2 V to 0 V and the NMOS M8 is set off. In the second output section 460, the NMOS M7 is set on and the PMOS M6 is set off. In this condition, electric charges of the capacitor C2 are stored having 2 V of an electric potential difference as it is, and therefore a voltage of a node N9 shifts from 0 V to −2 V with a change of the node N8 from 2 V to 0 V. At this moment, the parasitic diode D2 is set on and a voltage VN9 of the node N9 is constantly on until it reaches GND−VN9<VTD. Therefore, the voltage VN9 of the node N9=VDD−VTD equals −0.5 V. In addition, the NMOS M7 in the second output section 460 is on and therefore the node N3 is also at −0.5 V.

In the same manner as for the first embodiment, the voltage of the node N5 is 2.5 V and the PMOS M2 is on and therefore the node N4 is at 2.5 V.

According to this embodiment, a voltage equal to or greater than the supply voltage and a voltage equal to or smaller than the ground voltage can be applied to the analog switch 110. Therefore, even if the supply voltage is lowered, percentages of a reduction of transconductance of the NMOS M4 and the PMOS M5 can be relatively low. Accordingly, it is possible to lower a voltage of electronic equipment in which the semiconductor integrated circuit 400 is used.

While the preferred embodiments of a semiconductor integrated circuit according to the present invention are described above with referring to accompanying drawings, the present invention is not limited to these embodiments. It is apparent that those skilled in the art can conceive various alterations or modifications within the scope of technical idea according to the claims and it is understood that they also belong to the technical scope of the present invention naturally.

For example, while an example of driving a gate of an analog switch is shown in the above embodiments, a driver according to the present invention is not limited to this and the driver is also applicable to one for driving a logical gate of an inverter or the like requiring large demanded transconductance gm.

As set forth hereinabove, according to the present invention, a voltage equal to or greater than a supply voltage can be applied to an element requiring large transconductance gm. Therefore, even if a supply voltage is lowered, a percentage of a reduction of the transconductance gm of the element can be suppressed to be relatively low. Accordingly, it is possible to lower a voltage of electronic equipment in which this kind of element is used.

Particularly, according to the invention, a fluctuation of a voltage from an output section can be suppressed. Therefore, it is possible to suppress effects of supply voltage fluctuations on the element so as to obtain stable characteristics. Furthermore, by controlling this voltage source, transconductance gm can be adjusted even after the element is mounted.

Furthermore, according to the invention, a voltage equal to or greater than the supply voltage can be applied to the element and a ground voltage or lower voltage can also be applied to the element, a reduction of the transconductance can be relatively low even if the supply voltage is decreased. Therefore, it is possible to lower a voltage of electronic equipment in which this kind of semiconductor integrated circuit is used and to produce a superior effect on a driving section to which a voltage equal to or smaller than the ground voltage is effectively applied.

What is claimed is:

1. A semiconductor integrated circuit, comprising:
    a boosting section that generates a voltage equal to or greater than a supply voltage;
    a first output section that outputs the voltage equal to or greater than the supply voltage generated by said boosting section, according to an input signal connected to said boosting section;
    a step-down section that generates a voltage equal to or smaller than a ground voltage; and
    a second output section that outputs the voltage equal to or smaller than the ground voltage generated by said step-down section, according to the input signal as connected to said step-down section.

2. A semiconductor integrated circuit according to claim 1, wherein said boosting section comprises a first capacitor for storing electric charges equivalent to at least a difference between the voltage equal to or greater than said supply voltage and said supply voltage.

3. A semiconductor integrated circuit according to claim 1, wherein said boosting section generates the voltage equal to or greater than said supply voltage by using an independent voltage source having small voltage fluctuations.

4. A semiconductor integrated circuit according to claim 2, wherein said boosting section generates the voltage equal to or greater than said supply voltage by using an independent voltage source having small voltage fluctuations.

5. A semiconductor integrated circuit according to claim 1, wherein said step-down section includes a second capacitor that stores electric charges equivalent to at least a difference between said ground voltage and the voltage equal to or smaller than said ground voltage.

6. A semiconductor integrated circuit, comprising:
- a first transistor of a switch that transmits an input signal provided at one terminal to another terminal, according to a voltage provided at a gate electrode of said first transistor;
- a boosting section that generates a voltage higher than a supply voltage;
- an output section that supplies the voltage generated by said boosting section to the gate electrode of said first transistor of the switch; and
- a second transistor coupled to said first transistor in parallel, said second transistor having a conductivity type different than a conductivity type of said first transistor and having a gate electrode supplied with the supply voltage or a ground voltage.

7. A semiconductor integrated circuit according to claim 6, wherein the voltage generated by said boosting section is supplied to the gate electrode of said first transistor via an inverter.

8. A semiconductor integrated circuit according to claim 6, wherein said boosting section comprises a third transistor, a conductive type of said third transistor being the same as said conductivity type of said second transistor.

9. A semiconductor integrated circuit comprising:
- a boosting section that generates a voltage equal to or greater than a supply voltage as a first voltage; and
- an output section that outputs the first voltage, based on an input signal provided to said boosting circuit,
- said boosting section including
  - a transistor having a first terminal connected to the supply voltage, a second terminal connected to a node and a gate coupled to the input signal, and
  - a capacitor having a first terminal connected to the gate of the transistor and a second terminal connected to the node,
  - the first voltage being provided to said output section via the node.

10. The semiconductor integrated circuit of claim 9, wherein said transistor is a PMOS transistor.

11. The semiconductor integrated circuit of claim 9, further comprising a parasitic diode coupled to the node.

12. The semiconductor integrated circuit of claim 9, wherein said capacitor stores electric charge equivalent to at least a difference between the voltage equal to or greater than the supply voltage and the supply voltage.

13. The semiconductor integrated circuit of claim 9, further comprising:
- a step-down section that generates a voltage equal to or smaller than a ground voltage as a second voltage; and
- a second output section that outputs the second voltage, based on the input signal that is provided to said step-down section.

14. The semiconductor integrated circuit of claim 13, wherein said step-down section comprises:
- a second transistor having a first terminal connected to the ground voltage, a second terminal connected to a second node and a gate coupled to the input signal; and
- a second capacitor having a first terminal coupled to the gate of the second transistor and a second terminal connected to the second node,
- the second voltage being provided to said second output section via the second node.

15. The semiconductor integrated circuit of claim 14, wherein said second transistor is an NMOS transistor.

16. The semiconductor integrated circuit of claim 14, wherein said step-down section further comprises a parasitic diode coupled to the second node.

17. The semiconductor integrated circuit of claim 14, wherein said second capacitor stores electric charge equivalent to at least a difference between the supply voltage and the voltage equal to or smaller than the ground voltage.

* * * * *